US007127632B2

(12) United States Patent
Takala et al.

(10) Patent No.: US 7,127,632 B2
(45) Date of Patent: Oct. 24, 2006

(54) METHOD AND DEVICE FOR SYNCHRONIZING INTEGRATED CIRCUITS

(75) Inventors: Janne Takala, Tampere (FI); Sami Mäkelä, Tampere (FI)

(73) Assignee: Nokia Corporation, Espoo (FI)

( * ) Notice: Subject to any disclaimer, the term of this patent is extended or adjusted under 35 U.S.C. 154(b) by 546 days.

(21) Appl. No.: 10/298,307

(22) Filed: Nov. 18, 2002

(65) Prior Publication Data

US 2003/0094983 A1    May 22, 2003

(30) Foreign Application Priority Data

Nov. 20, 2001   (FI)   ................................. 20012257

(51) Int. Cl.
*G06F 1/14*   (2006.01)
*G06F 1/12*   (2006.01)

(52) U.S. Cl. ...................... 713/502; 713/375; 713/400; 713/500; 713/502; 700/1; 700/82; 700/296; 700/3; 714/707; 714/731; 714/744; 714/775; 968/906; 968/909

(58) Field of Classification Search ................ 713/375, 713/400, 500, 502, 600; 700/1, 2, 3, 82, 700/296; 714/12, 707, 731, 744, 775; 968/906, 968/909
See application file for complete search history.

(56) References Cited

U.S. PATENT DOCUMENTS

| 3,683,415 | A |   | 8/1972  | Llyod et al. ............ 340/147 C |
| 4,426,637 | A | * | 1/1984  | Apple et al. ............ 340/825.65 |
| 4,750,010 | A | * | 6/1988  | Ayers et al. ................. 347/237 |
| 4,847,516 | A |   | 7/1989  | Fujita et al. ................. 307/269 |
| 5,384,906 | A | * | 1/1995  | Horst ......................... 713/375 |
| 5,394,114 | A |   | 2/1995  | Davis ......................... 331/1 A |
| 5,416,808 | A | * | 5/1995  | Witsaman et al. .......... 375/356 |
| 5,485,114 | A | * | 1/1996  | Funakura et al. ........... 327/262 |
| 5,486,783 | A | * | 1/1996  | Baumert et al. ............ 327/147 |
| 5,604,775 | A | * | 2/1997  | Saitoh et al. ............... 375/376 |
| 5,646,966 | A | * | 7/1997  | Chaki et al. ................ 375/368 |
| 5,652,627 | A | * | 7/1997  | Allen ......................... 348/497 |
| 5,699,392 | A | * | 12/1997 | Dokic ......................... 375/376 |
| 5,715,438 | A | * | 2/1998  | Silha ........................... 713/400 |
| 5,832,254 | A | * | 11/1998 | Brewer ....................... 713/375 |
| 5,852,728 | A | * | 12/1998 | Matsuda et al. ............ 713/501 |
| 5,896,524 | A | * | 4/1999  | Halstead et al. ............ 713/375 |
| 5,958,060 | A | * | 9/1999  | Premerlani .................. 713/400 |
| 6,055,644 | A |   | 4/2000  | Henkel ........................ 713/500 |
| 6,108,389 | A | * | 8/2000  | Morariu et al. ............. 375/355 |
| 6,356,795 | B1 | * | 3/2002  | Barthel et al. ................ 700/82 |
| 6,587,694 | B1 | * | 7/2003  | Mooney et al. ............. 455/502 |
| 6,798,790 | B1 | * | 9/2004  | Enssle et al. ............... 370/503 |
| 6,865,686 | B1 | * | 3/2005  | Krause et al. .............. 713/400 |
| 2003/0189953 | A1 | * | 10/2003 | Matsumura et al. ........ 370/503 |

FOREIGN PATENT DOCUMENTS

| EP | 0281376 A2    | 3/1988 |
| EP | 0306662 A2    | 7/1988 |
| EP | 0903660 A1    | 3/1999 |
| GB | 2347287 A     | 8/2000 |
| WO | WO-96/02877 A3 | 2/1996 |
| WO | WO-02/065259 A1 | 8/2002 |

\* cited by examiner

*Primary Examiner*—Lynne H. Browne
*Assistant Examiner*—Nitin C. Patel
(74) *Attorney, Agent, or Firm*—Harrington & Smith, LLP

(57) ABSTRACT

A method and device for synchronizing the time between at least two integrated circuits (201, 202), which receive the same pulse signal. In the integrated circuits (201, 202) a counter (204, 206) is used to count the number of pulses in the received pulse signal to synchronize the common time between said integrated circuits.

17 Claims, 5 Drawing Sheets

METHOD AND DEVICE FOR SYNCHRONIZING INTEGRATED CIRCUITS

The present invention relates to a method and device for synchronising the time, and particularly, but not exclusively, for improving the accuracy of time stamps between several integrated circuits.

BACKGROUND OF THE INVENTION

In prior art solutions, integrated circuits in an electronic device, such as a computer, are synchronised using an external clock, with intentional delays in the signal as appropriate to provide the input channels of all integrated circuits with the same time signal. These systems have contained several channels, all of which could be fed with a time signal.

A prior art solution is illustrated in the publication U.S. Pat. No. 4,847,516, which describes a system where the clock signal can be fed into several signal lines so that a simultaneous signal will go through the lines to load units at the ends of the lines. This is accomplished by means of appropriate delays built into the signal lines to make the signals simultaneous. Publication U.S. Pat. No. 6,055,644 describes a similar multichannel system that makes it possible to feed independent signals into each channel. The system comprises a central clock for generating the main clock signal, as well as several channels that can be connected to the device's inputs or outputs.

Synchronising several integrated circuits is a new problem, because in earlier systems, only one integrated circuit has performed one or more specific tasks. Therefore, the solutions described above do not provide a solution for synchronising several integrated circuits in a system where one or more specific tasks are divided between two or more integrated circuits.

SUMMARY OF THE INVENTION

A method and device has been invented for improving the accuracy of time stamps in an electronic device comprising more than one integrated circuit (IC). In the invention, common time information is distributed to several integrated circuits, which makes it possible to use the same time in all the integrated circuits. Each integrated circuit preferably comprises a counter for counting the pulses of the common clock signal and means for initializing the said counters to an initial value using a common reset signal, for example in connection with starting an electronic device, such as a communications device. In a preferred embodiment of the invention, when data processing is divided between several integrated circuits, the time information or time stamp is distributed to each of the integrated circuits. A time stamp refers to information attached to transaction data or a record indicating, for example, the processing time of a task. The implementation according to the invention makes it possible to achieve a high time resolution. Also, the invention is simple to implement, as no signals other than the clock and reset signals are required between the integrated circuits, which means that no additional outputs and inputs for synchronisation purposes are required in the integrated circuits.

The implementation of the invention is simple and facilitates distributed data processing between several integrated circuits. The counters of the integrated circuits are independent of external systems and do not require continuous monitoring. The novelty of the invention is the method of distributing the time information to several IC's using internal counters initialized (reset) from a common source and fed with a clock signal from a common source.

According to a first aspect of the invention, there is implemented a method for establishing common time information between at least two integrated circuits, where at least one integrated circuit receives a clock signal. The method is characterized in that in each of said at least two integrated circuits: the number of pulses in the received pulse signal is counted and the common time information between said at least two integrated circuits is established on the basis of counting the number of said pulses.

According to a second aspect of the invention, there is implemented an integrated circuit for establishing common time information between said integrated circuit and at least one other integrated circuit. The integrated circuit comprises receiving means for receiving a clock signal, and is characterized in that it further comprises counting means for counting a number of pulses of said clock signal and establishment means for establishing the common time information between said integrated circuit and the at least one other integrated circuit on the basis of counting the number of said pulses.

According to a third aspect of the invention, there is implemented an electronic device comprising at least two integrated circuits, said at least two circuits comprising receiving means for receiving common clock signal from a clock signal source. The electronic device is characterized in that it further the comprises in each of said at least two integrated circuits: counting means for counting a number of pulses of said common clock signal and establishment means for establishing common time information between said at least two integrated circuits on the basis of counting the number of said pulses.

BRIEF DESCRIPTION OF THE DRAWINGS

In the following, the invention will be discussed in more detail by referring to the enclosed drawings, in which.

DETAILED DESCRIPTION OF THE INVENTION

Figure 1:
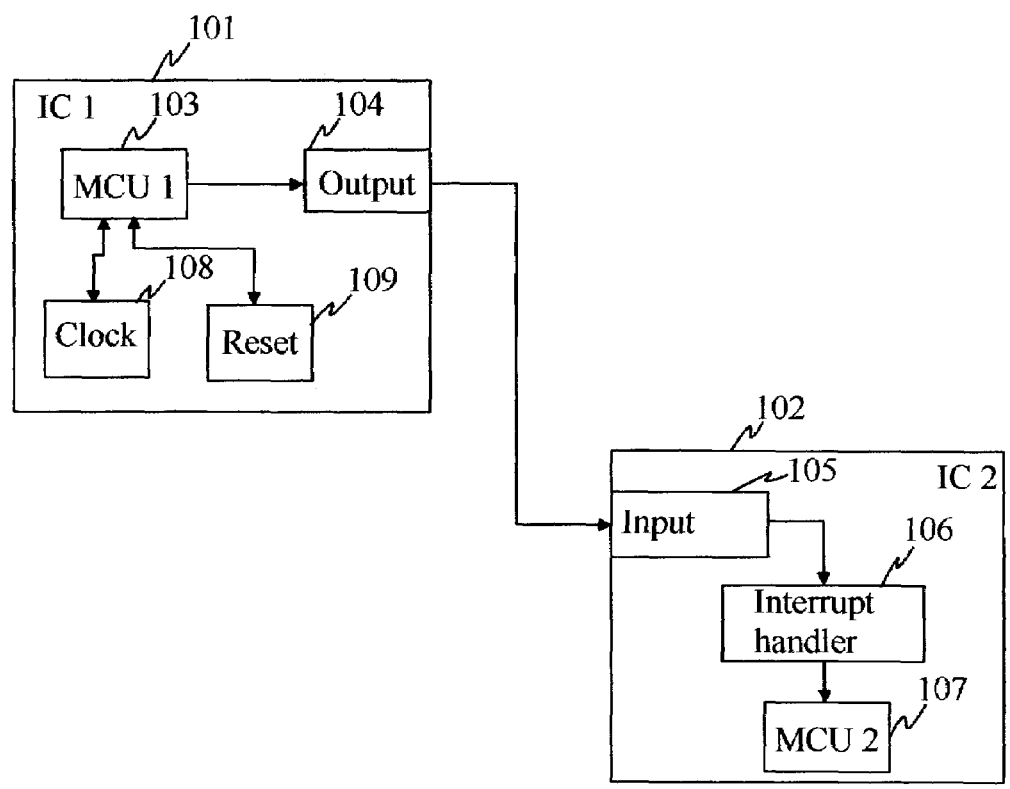
FIG. 1 illustrates a device according to an embodiment.

FIG. 1 illustrates a device 100, according to an embodiment. The device 100 comprises a first integrated circuit 101, which further comprises a Micro Controller Unit (MCU1) 103 and an output port 104. The device 100 additionally comprises a second integrated circuit 102, which further comprises an input port 105, an interrupt handler 106 and a micro controller 107 (MCU2).

The first micro controller 103 causes a change in the output of the first integrated circuit 101, due to sending a time stamp; the change is subject to timing uncertainty d1.

Timing uncertainty refers to a change in the output of the first integrated circuit 101 caused by a program running in the micro controller 103 writing a value to the register controlling said output of the first integrated circuit 101. Depending on the state of the first integrated circuit 101, there will be variations in the delay between executing the register write instruction (in the program running in the micro controller 103) and the actual change of the output value. Timing uncertainty refers to the variation in this delay. The change will propagate to the input of the second integrated circuit 102, which is subject to timing uncertainty d2. The change in the input triggers an interruption, which is handled in the interrupt handler 106 and is subject to timing uncertainty d3. When the second micro controller 107 receives information on the change, the total timing uncertainty is D=d1+d2+d3. Because d3>>d2 and d3>>d1, d3 is the dominant uncertainty factor. Depending on the state of the second micro controller 107, the timing uncertainty d3 of the interrupt handler may be fairly large. If interrupts are disabled, for example, d3 can be e.g. 100 processor clock cycles, while d1 and d2 are e.g. less than 5 clock cycles. In addition, because d3 is dependent on the software implementation, it will not always be known. Thus, it can be difficult to determine the largest possible timing uncertainty.

Due to total timing uncertainty, the micro controller 107 in the second integrated circuit 102 will receive the time stamp sent by the first micro controller 103 at time T+D. This will result in a situation where the second micro controller 107 is not synchronised to the same time with the first micro controller 103.

Figure 2:
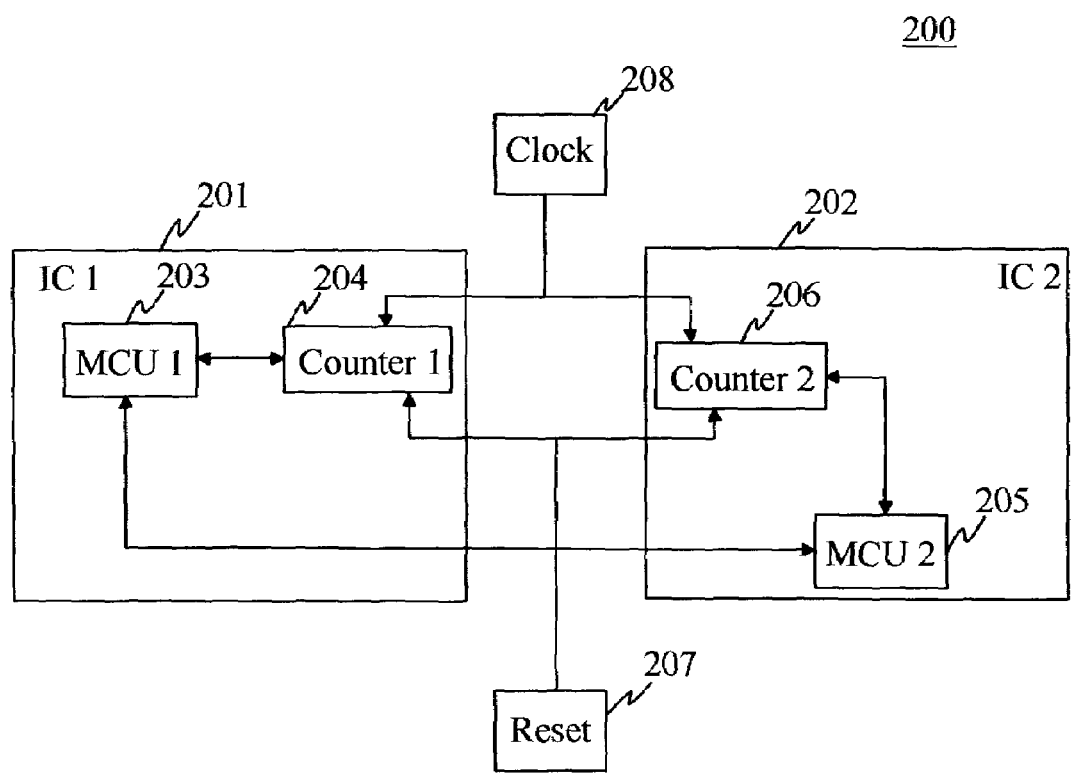
FIG. 2 illustrates a device according to a preferred embodiment of the invention.

FIG. 2 illustrates a device 200 according to a preferred embodiment of the invention, deviating from the embodiment in FIG. 1. The device comprises a first integrated circuit 201 and at least one other integrated circuit 202. The first integrated circuit 201 further comprises a processor 203, such as a micro controller (MCU1) or microprocessor for controlling the functions of the integrated circuit 201, as well as a counter 204 for receiving the clock signal and reset signal. The second integrated circuit 202 further comprises a processor 205, such as a micro controller (MCU2) or microprocessor for controlling the functions of the integrated circuit 202, as well as a counter 206 for receiving the clock signal and reset signal. The device 200 may further comprise a clock signal source 208 and a reset signal source 207. Alternatively, the clock signal and reset signal sources may be located in one of the integrated circuits 201 and 202 in the device 200, or external to the device 200.

To divide the data processing between several integrated circuits, 201, 202, the micro controllers 203, 205 in each integrated circuit require common time information. Each integrated circuit contains a counter 204, 206, using common clock and reset signals. The clock signal is generated in the clock signal source 208, and the reset signal is generated in the reset signal source 207, respectively. The counters 204 and 206 are first initialised, for example, by setting their values to 0. The initialisation can be performed, for example, in connection with starting the device 200. The first micro controller, 203 and the second micro controller, 205, respectively, will read the time information, that is, the value of the counter 204 (counter 206, respectively). The value can be read, for example, using a computer program in the integrated circuits (references 201 and 202). The clock signal, whose frequency can be e.g. 32 kHz, is used to increment (or, alternatively, decrement) the values of the counters, and the reset signal from the source 207 is used to reset the values of the counters, for example to a value of zero. Because the counters 204 and 206 use the same clock and reset signals, the values of the counters are the same in both integrated circuits, that is, both integrated circuits have the same time information. The time resolution is determined by the frequency of the clock signal source. The solution according to FIG. 2 does not have the uncertainty factors d3 and d1 shown in FIG. 1, so the timing accuracy is better than in the implementation shown in FIG. 1. In addition, the presented solution does not require the input and output pins (references 104 and 105) of the integrated circuits illustrated in FIG. 1.

Figure 3A:
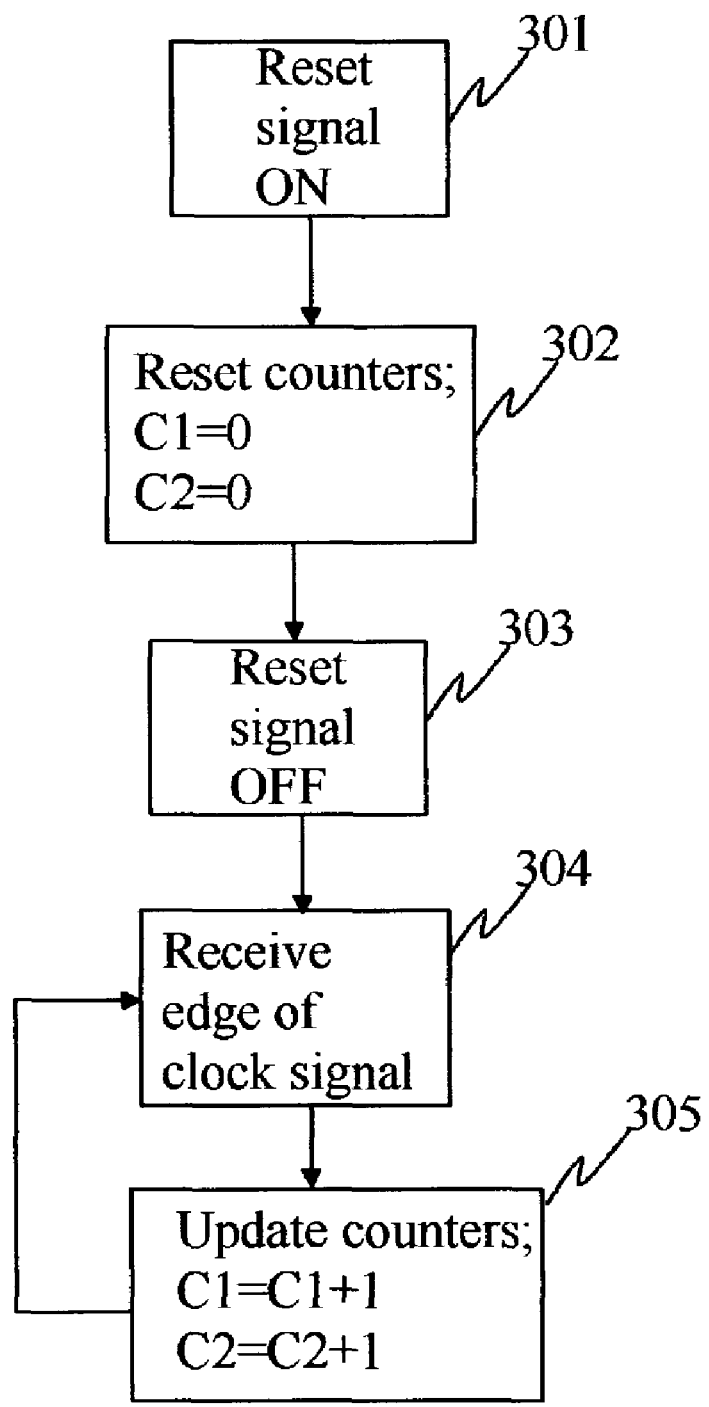
FIG. 3a is a flow diagram for synchronising the counters according to an embodiment of the invention.

FIG. 3a is a flow diagram according to an embodiment of the invention for synchronising the counters of two separate integrated circuits by reference to FIG. 2, where the counter 204 corresponds to the counter C1 in FIG. 3a, and counter 206 corresponds to the counter C2 in FIG. 3a, respectively. It should be noted that the invention is not limited to the case with two integrated circuits as illustrated in FIGS. 3a to 3c; a larger number of integrated circuits can also be synchronised with each other using the method according to the invention.

In Phase 301, the reset signal is activated; after this, in Phase 302, the counters C1 and C2 are initialised to a known initial value, e.g. the value 0. In Phase 303, the reset signal is deactivated; after this, in Phase 304, each counter, C1 and C2, waits for the raising edge (or, alternatively, the falling edge) of the clock signal pulse. When the raising edge (or, alternatively, the falling edge) of the clock signal has arrived at the counters C1 and C2, in Phase 305, the value of the counters C1 and C2 is incremented (or, alternatively, decremented) by one, after which the process continues from Phase 304 immediately after incrementing the value of the counters in Phase 305. The value of the counters C1 and C2 can be read e.g. by the processor, such as a micro controller, independent of the current phase of the method. Because the same state diagram applies to both circuits, and the state transitions are only dependent on the common signals (clock and reset signals), both counters C1 and C2 will have the same value.

Figure 3B:
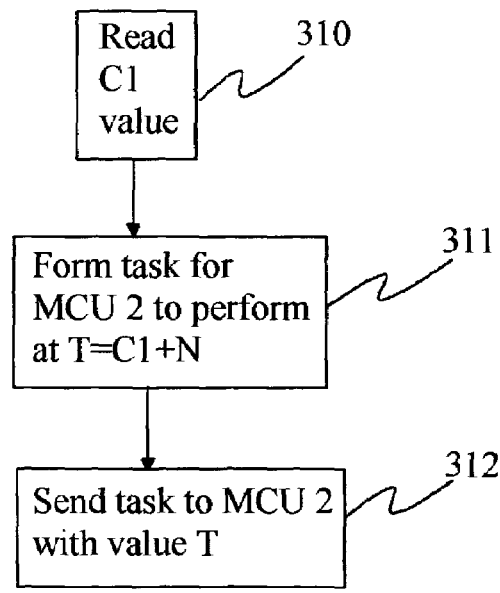
FIG. 3b is a flow diagram for sending a task according to an embodiment of the invention.
Figure 3C:
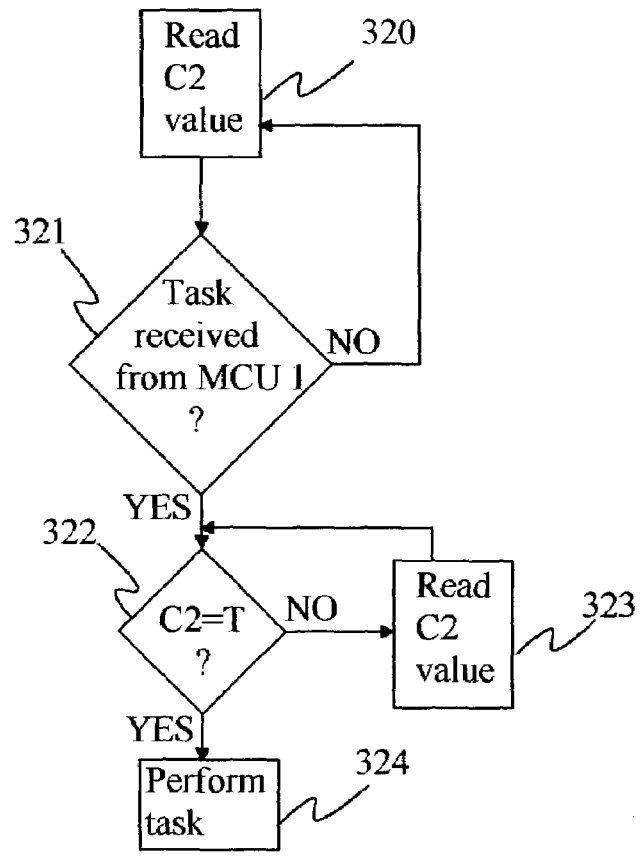
FIG. 3c is a flow diagram for receiving a task according to an embodiment of the invention.

FIG. 3b is a flow diagram according to an embodiment of the invention for sending a task from the first integrated circuit to the second integrated circuit, using the system illustrated in FIG. 2 as an example.

In Phase 310, the first micro controller 203 reads the value C1 of the counter 204. In Phase 311, the first micro controller 203 generates a task for the second micro controller 205, to be performed at time T=C1+N, after which, in Phase 312, the first micro controller 203 sends the task to the second micro controller 205. Said task comprises the moment of time T when the second micro controller 205 has to perform said task.

FIG. 3c is a flow diagram according to an embodiment of the invention for receiving and performing a task with an integrated circuit, using the system illustrated in FIG. 2 as an example.

In Phase 320, the second micro controller 205 reads the value C2 of the counter 206, after which, in Phase 321, the second micro controller examines whether a task has been received from the first micro controller 203. It should be noted that the second micro controller 205 may have several tasks pending, and this example describes the simplest embodiment. In Phase 321, if no tasks have been received from the first micro controller 203, Phases 320, 321 will be continued until a task is received; after this, the process continues from Phase 322, where the value C2 of the counter 206 is compared to the value T in the received task. If this is not the case, the value C2 of the counter 206 will be read until C2=T, after which said task will be performed in Phase 324.

Figure 4:
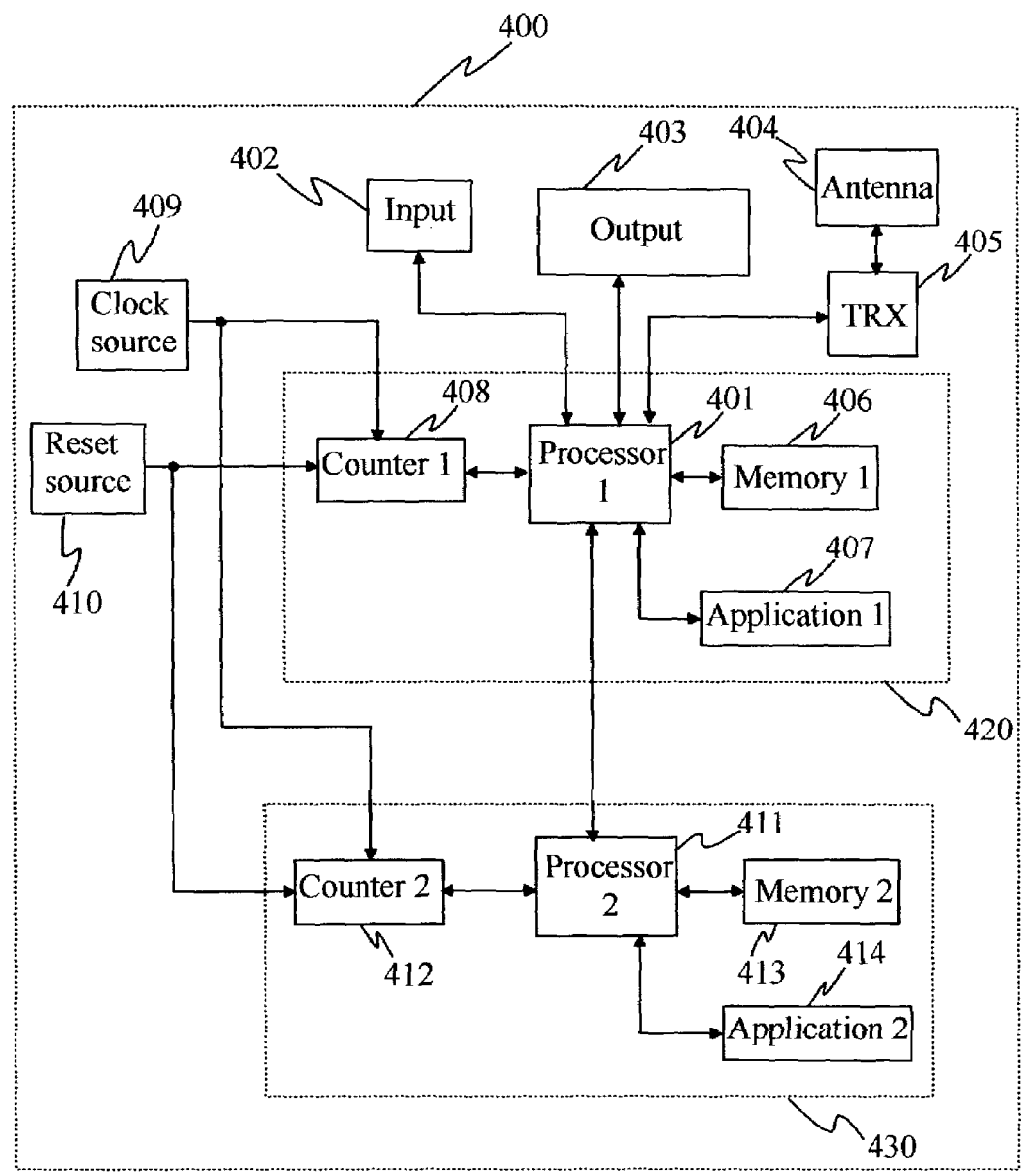
FIG. 4 illustrates a communications device according to an embodiment of the invention.

FIG. 4 illustrates a communications device 400, according to an embodiment of the invention, preferably a communications device in a cellular system, for example, a GSM communications device. The communications device 400 comprises means 402, such as a keypad or touch-sensitive display for entering data into the communications device, means for transmitting data wirelessly between the communications device and, for example, a communications network, for example, an antenna 404 and a transceiver 405, at least one application 407 for execution in the communications device 400, memory 406 and a first processor 401 for implementing the functions of the communications device, as well as a first counter 408 for receiving clock signal pulses from the clock source 409 and counting them and for receiving a reset signal from the reset signal source 410 for initialising said counter 408.

The communications device 400 additionally comprises a second processor 411, memory 413 and at least one other application 414, to be executed by the processor 411, as well as a second counter 412 for receiving clock signal pulses from the clock source 409 and counting them and for receiving a reset signal from the reset signal source 410 for initialising said counter 412.

When the communications device 400 is started, the reset signal is fed from the reset signal source 410 to both counters 408 and 412, initialising both counters to the same value. After this, the clock signal is fed from the clock signal source to both counters 408 and 412, which count the total number of raising or, alternatively, falling edges in said signal by incrementing or, alternatively, decrementing the value of the counter by one unit in response to each raising or falling edge of the clock signal received.

The processor 401 is able to read the value of the counter 408, for example, by means of the application 407. Correspondingly, the processor 411 is able to read the value of the counter 412, for example, by means of said application 407, or, alternatively, by means of application 414. The processor 401 is able to generate a task for the processor 411 to be executed at a certain moment of time T. The processor 401 reads the value C1 of the counter 408, generates a task for the processor 411, to be executed at time T=C1+N and sends the task to the processor 411. The value C1 is the present value of the counter, and N is a number, preferably an integer. Next, the processor 411 receives said task, compares said time T with the value C2 of the counter 412 and executes said task when the value of the counter 412 equals the time T. Correspondingly, the processor 411 is able to generate a task for the processor 401 to be executed at a certain moment of time T.

This paper presents the implementation and embodiments of the present invention, with the help of examples. A person skilled in the art will appreciate that the present invention is not restricted to details of the embodiments presented above, and that the invention can also be implemented in another form without deviating from the characteristics of the invention. The embodiments presented above should be considered illustrative, but not restrictive. Thus, the possibilities of implementing and using the invention are only restricted by the enclosed claims. Consequently, the various options for implementing the invention as determined by the claims, including the equivalent implementations, also belong to the scope of the invention.

The invention claimed is:

1. A method for establishing common time information between at least two integrated circuits, where at least one integrated circuit receives a clock signal, wherein in each of said at least two integrated circuits:

a number of pulses of said clock signal is calculated, and the common time information between said at least two integrated circuits is established on the basis of counting the number of said pulses.

2. A method according to claim 1, wherein said clock signal is generated in one of said integrated circuits.

3. A method according to claim. 1, wherein said clock signal is generated outside said integrated circuits.

4. A method according to claim 2, wherein said pulses of said clock signal are counted using a counter in each integrated circuit.

5. A method according to claim 4, wherein the method further comprises a generation of a reset signal in at least one of said integrated circuits.

6. A method according to claim 4, wherein the method further comprises a generation of a reset signal outside said integrated circuits.

7. A method according to claim 5, wherein the method further comprises an initialization of each counter to a same value in response to the received reset signal.

8. A method according to claim 7, wherein said common time information is further established by sending a message from the first integrated circuit to the second integrated circuit, said message comprising a task to be executed and the time when said task is to be executed.

9. A method according to claim 8, wherein said common time information is further established by executing said task in the integrated circuit receiving said message at a moment of time when a value of the counter in said receiving integrated circuit equals the time received in said message.

10. An integrated circuit for establishing common time information between said integrated circuit and at least one other integrated circuit, comprising receiving means for receiving a clock signal, wherein said integrated circuit further comprises;

counting means for counting a number of pulses of said clock signal, and establishment means for establishing the common time information between said integrated circuit and the at least one other integrated circuit on the basis of counting the number of said pulses.

11. An integrated circuit according to claim 10, wherein said circuit further comprises receiving means for receiving a reset signal.

12. An integrated circuit according to claim 10, wherein said circuit further comprises generation means for generating a reset signal.

13. An integrated circuit according to claim 11, wherein said circuit further comprises initialization means for initializing a value of a counter in response to a received reset signal.

14. An integrated circuit according to claim 13, wherein said establishment means comprise message sending means for sending a message from said integrated circuit to at least one other integrated circuit, said message comprising a task to be executed in said at least one other circuit and the time when said task is to be executed.

15. An integrated circuit according to claim 14, wherein said establishment means further comprise task execution means for executing a task in a received message at the moment of time when the value of the counter in said integrated circuit is equal to the time specified in the received message.

16. An electronic device comprising at least two integrated circuits, said at least two integrated circuits comprising receiving means for receiving a common clock signal from a clock signal source, wherein the device further comprises in each of said at least two integrated circuits:

counting means for counting a number of pulses of said common clock signal, and establishment means for establishing common time information between said at least two integrated circuits on the basis of counting the number of said pulses.

17. A device according to claim 16, wherein said device is a wireless communications device.

* * * * *